United States Patent [19]

Taniquchi et al.

[11] Patent Number: 5,731,690
[45] Date of Patent: Mar. 24, 1998

[54] ELECTRIC POWER SUPPLY SYSTEM FOR VEHICLE

[75] Inventors: Makoto Taniquchi, Obu; Atsushi Umeda, Okazaki; Shin Kusase, Obu, all of Japan

[73] Assignee: Nippondenso Co., Ltd., Kariya, Japan

[21] Appl. No.: 640,314

[22] Filed: Apr. 30, 1996

[30] Foreign Application Priority Data

| May 11, 1995 | [JP] | Japan | 7-112792 |
| Jan. 17, 1996 | [JP] | Japan | 8-006110 |

[51] Int. Cl.⁶ ............................................. H02J 7/14
[52] U.S. Cl. ................................................ 322/28; 322/8
[58] Field of Search ............................... 322/28, 29, 90

[56] References Cited

U.S. PATENT DOCUMENTS

| 3,970,881 | 7/1976 | Sato | 310/68 D |
| 4,084,126 | 4/1978 | Clements | 322/8 |
| 4,316,134 | 2/1982 | Balan et al. | 322/99 |
| 4,701,692 | 10/1987 | Takeuchi et al. | 322/90 |
| 4,985,670 | 1/1991 | Kaneyuki et al. | 322/28 |
| 5,031,587 | 7/1991 | Tharman | 123/149 R |
| 5,095,222 | 3/1992 | Pierret et al. | 307/10.1 |
| 5,323,102 | 6/1994 | Torii et al. | 322/90 |
| 5,355,071 | 10/1994 | Ishida et al. | 320/6 |
| 5,418,401 | 5/1995 | Kaneyuki | 307/10.1 |
| 5,543,703 | 8/1996 | Kusase et al. | 322/16 |
| 5,608,310 | 3/1997 | Watanabe | 322/29 |

FOREIGN PATENT DOCUMENTS

| 660501 | 6/1995 | European Pat. Off. . |
| 5-276686 | 10/1993 | Japan . |
| 1083306 | 9/1967 | United Kingdom . |
| 1151857 | 5/1969 | United Kingdom . |
| 2255243 | 10/1992 | United Kingdom . |
| 2283138 | 4/1995 | United Kingdom . |

*Primary Examiner*—Steven L. Stephan
*Assistant Examiner*—Nicholas Ponomarenko
*Attorney, Agent, or Firm*—Cushman Darby & Cushman IP Group of Pillsbury Madison & Sutro LLP

[57] ABSTRACT

In an electric power supply system including an alternator generating a low-voltage for energizing a battery and a low-voltage load and a high-voltage for energizing a high-voltage load such as a heater for a catalytic converter. Switching elements are disposed in an alternator housing to supply a low-voltage load and a high-voltage load selectively. The switching elements compose a part of rectifying unit for supplying DC output power to the high-voltage or low-voltage load.

13 Claims, 12 Drawing Sheets

ELECTRIC POWER SUPPLY SYSTEM FOR VEHICLE

CROSS REFERENCE TO RELATED APPLICATION

The present application is based on and claims priority from Japanese Patent Applications No. Hei 7-112792 filed on May 11, 1995 and No. Hei 8-6110 filed on Jan. 17, 1996, the contents of which are incorporated herein by reference.

BACKGROUND OF THE INVENTION

1. Field of the Invention

The present invention relates to an electric power supply system and, more particularly, relates to an electric power supply system for a vehicle including an alternator.

2. Description of the Related Art

In general, a vehicle has been equipped with a 12 V rated battery and loads. Recently, however, electric loads powered by voltages higher than 12 V are being installed in a vehicle in order to provide a more comfortable drive and a more powerful exhaust gas control.

U.S. Pat. No. 4,084,126 (or corresponding Japanese Patent Publication 61-33725) discloses an alternator having a voltage regulator and a rectifier therein, an outside relay switch circuit connected to the voltage regulator, low-voltage loads (including a vehicle battery) and a high-voltage load, such as a heater.

When the high-voltage load is energized, the relay switch circuit disconnects the low-voltage loads from the regulator, so that battery voltage is applied to the low-voltage load and a high voltage (24 V) is applied to the high-voltage load from the alternator.

Generally, the relay switch circuit of the above described structure is disposed outside the alternator and, therefore, connecting wires are necessary.

In order to prevent a voltage drop in the wires, particularly when the relay switch circuit is connected to the low-voltage load, the wire has to have certain diameter, resulting in an increase of the wire cost.

SUMMARY OF THE INVENTION

In view of the above problem, the present invention provides an electric power supply system for a vehicle which has a built-in switching element to be connected to a low-voltage load and a high-voltage load.

Another object of the present invention is to provide an electric power supply system for a vehicle which comprises an alternator, a voltage regulator, a a rectifying unit, switching element and a control system for controlling the switching element; the switching element is disposed in the alternator housing and connected to multi-phase coils of the alternator through the rectifying unit for selectively supplying the DC output power to low-voltage loads including the battery or high-voltage loads.

Accordingly, connecting wires disposed between the rectifying unit and the switching element, that is between the alternator and the switching element can be reduced significantly, and cost of the power supply system can be reduced.

The switching element may compose at least a portion of the rectifying unit. The rectifying unit may comprise a low-side half-bridge circuit and a high-side half-bridge circuit and the semiconductor switching element may compose a portion of the high-side half-bridge circuit so that the switching element can be cooled by cooling fins of the alternator's main rectifying unit without a specific cooling unit for the switching element.

Further, the semiconductor switching element may comprise a SiC-MOSFET so that the semiconductor switching element is characterized by low loss, high voltage resistance, high temperature resistance and compact cooling fins. Accordingly, high reliability is ensured.

The control system may be included in the voltage regulator of the alternator so that a dedicated control circuit for the switching element can be omitted, resulting in a simple structure for the power supply system.

A further object of the present invention is to provide an electric power supply system for a vehicle which comprises an alternator, a first rectifying unit for supplying rectified output power to a battery and a first electric load, a second rectifying unit for supplying rectified output power to a second electric load, a first switching element connected between the first rectifying unit and the battery and the first electric load, a second switching element connected between the rectifying unit and the second electric load, and control system for controlling the first and second switching elements; wherein the first and second semiconductor switching elements are disposed inside the alternator together with the first and second rectifying units.

BRIEF DESCRIPTION OF THE DRAWINGS

Other objects, features and characteristics of the present invention, as well as the functions of related parts of the present invention will become clear from a study of the following detailed description, the appended claims and the drawings. In the drawings:

DESCRIPTION OF THE PREFERRED EMBODIMENTS

A first embodiment of the present invention is described with reference to FIG. 1–FIG. 4 hereinafter.

Figure 1:
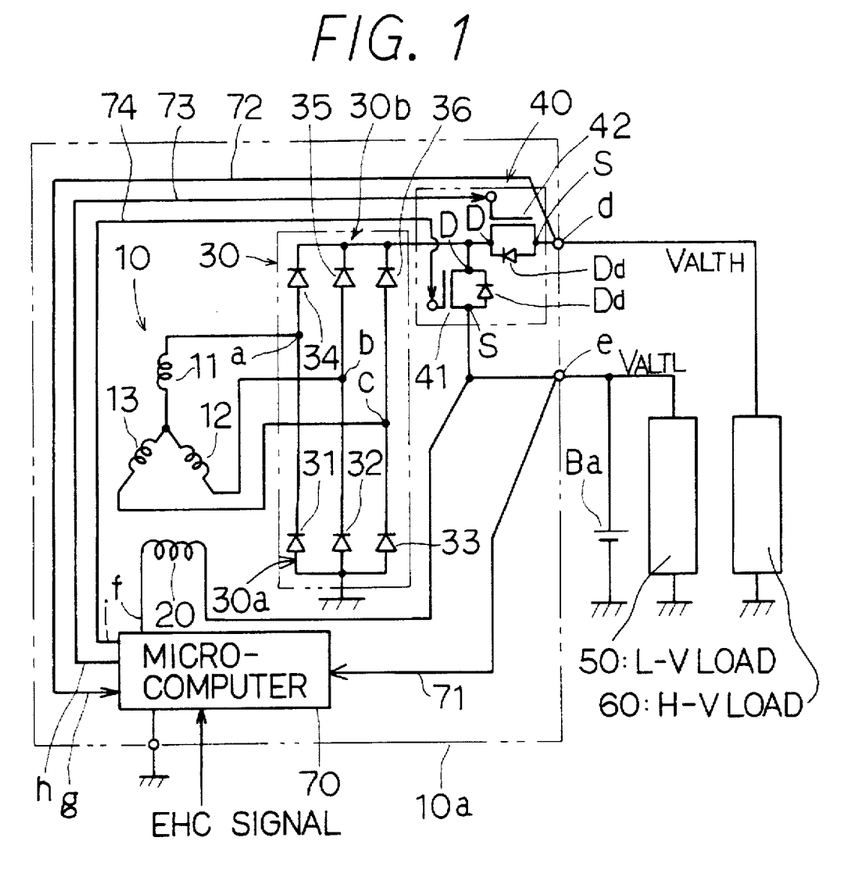
FIG. 1 is an electric circuit diagram showing a first embodiment of the present invention.
Figure 3:
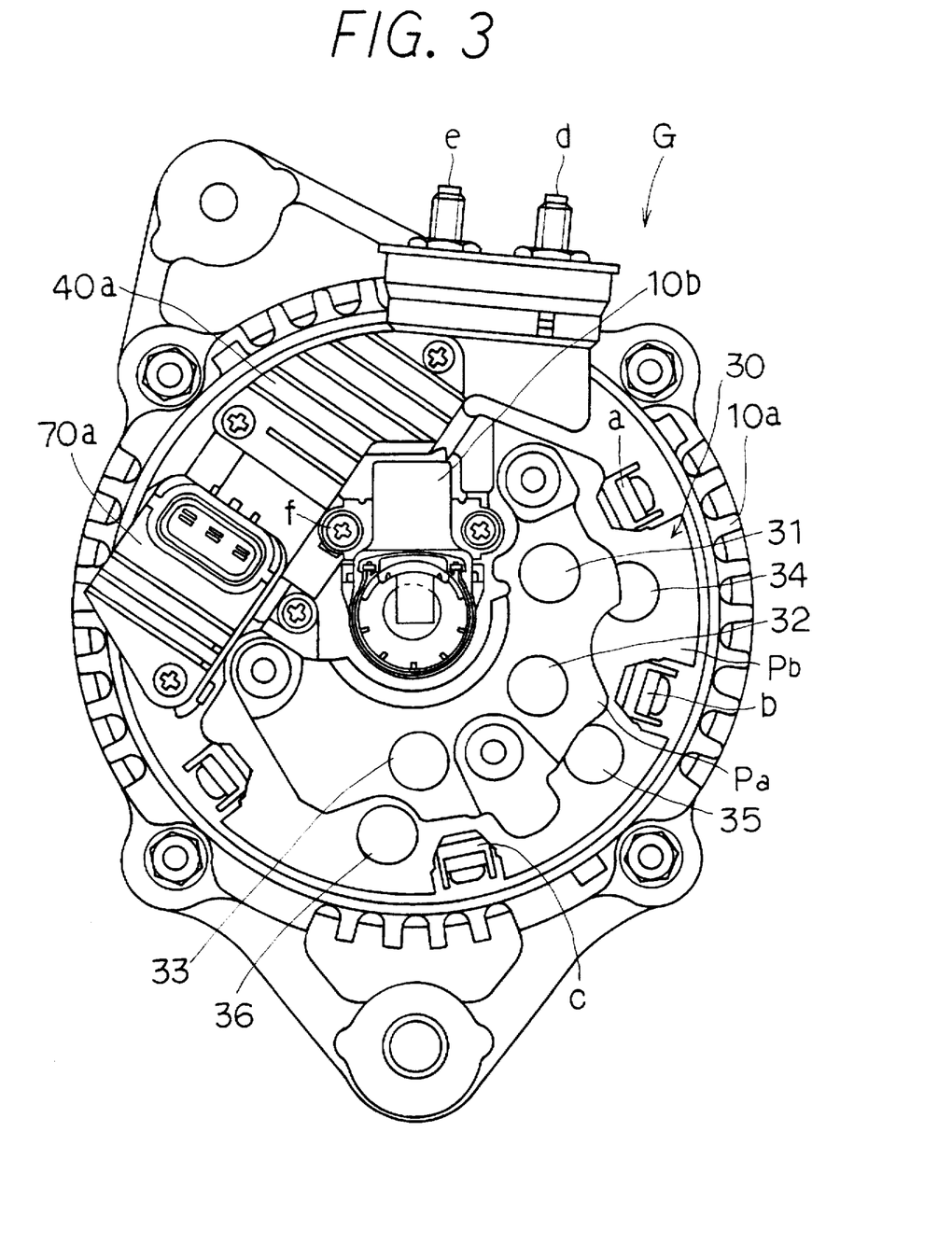
FIG. 3 is a schematic front view illustrating an arrangement of a rectifying unit, a semiconductor switching circuit and a microcomputer disposed in a housing of an alternator shown in FIG. 1.

FIG. 1 shows an example of an electric power supply system for a vehicle according to the present invention. The electric power supply system is equipped with an alternator G, as shown in FIG. 3, mounted in a vehicle, which includes a housing 10a, a stator having a three-phase star-connected winding 10 composed of armature coils 11–13 and a rotor having a field coil 20 disposed rotatably and coaxially in the stator.

Accordingly, the alternator G, when it is driven by an engine, generates an output voltage composed of three-phase AC voltages induced in the armature coils 11–13 according to field current If of the field coil 20.

The electric power supply system has a rectifying unit 30 which is composed of a low-side-half-bridge circuit 30a and a high-side-half-bridge circuit 30b to form a three-phase full-wave rectifier.

The low-side-half-bridge circuit 30a is composed of diodes 31–33, each of which has a grounded anode and a cathode connected to a corresponding output terminal of the armature coils 11–13.

The high-side-half-bridge circuit 30b is composed of diodes 34–36 and composes a three-phase full-wave rectifying circuit with the low-side-half-bridge circuit 30a.

Each of the diodes 34–36 has an anode connected to a corresponding cathode of one of the diodes 31–33 of the low-side half-bridge circuit 30a with one of the output terminals of the armature coils 11–13.

The power supply system has a semiconductor switching circuit 40 which includes a pair of SiC-MOSFETs 41 and 42. SiC-MOSFET 41 has a drain electrode D connected to the cathodes of the diodes 34, 35 and 36, respectively, and a source electrode S connected to the field coil 20 and grounded through a battery Ba and a low-voltage load 50, which are connected in parallel with each other. The battery Ba energizes the field coil 20 to form an initial magnetic field and energizes the low-voltage load 50.

The SiC-MOSFET 42 has a drain electrode D connected to a cathode of each of the diodes 34–36 and a source electrode S connected to a ground through the high-voltage load 60. The high-voltage load 60 is a heater of a catalytic converter for the vehicle (hereinafter referred to as EHC), which is energized by a voltage higher than the battery voltage for a while after the engine is started.

Figure 2:
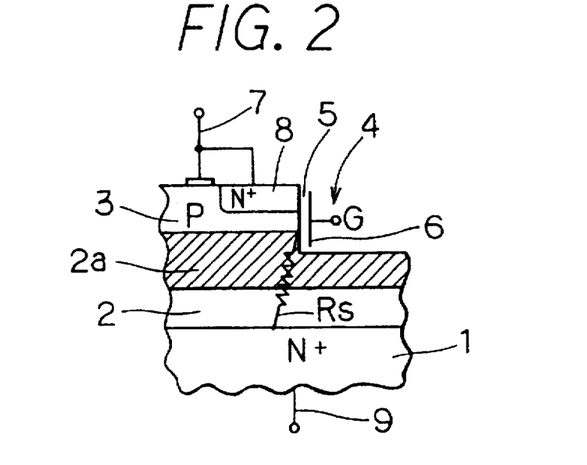
FIG. 2 is a cross-sectional side view illustrating a main portion of a SiC-MOSFET shown in FIG. 1.

The above mentioned SiC-MOSFETs 41 and 42 are formed as shown in FIG. 2 and controlled by a microcomputer 70 through each gate thereof to intermittently supply electric current as switches to the low-voltage load 50 and the high-voltage load 60.

The structure of the SiC-MOSFET is described with reference to FIG. 2 which illustrates a N-channel type thereof.

The SiC-MOSFET is formed as follows.

At first, a N-type insulating layer 2 is epitaxially grown on a $N^+$-type source plate 1 (which corresponds to the drain electrode D shown in FIG. 1). Then, a P-well region 3 is formed on the N-type insulting layer 2 by the Alminum ion-implantation. Further, $N^+$-type region (which corresponds to the source electrode S shown in FIG. 1) is formed on the P-well region 3 by the nitrogen-ion implantation.

Thereafter, a portion of the wafer is opened for a trench and is masked with a resist or an insulating film. Then, the trench 4 is formed by a well-known reactive-ion-etching method (RIE). Thereafter, a gate insulation layer of silicon oxide is formed by thermal oxidation process and a gate electrode 6 of doped poly-silicon is formed on the trench 4.

A metal electrode 7 is fixed to, and in contact with, surfaces of the $N^+$-type region 8 and the P-well region 3, and a metal electrode 9 is fixed, in contact with, to the $N^+$-type source plate 1. Thus, the SiC-MOSFETs are formed, and shown in FIG. 1 as an equivalent circuit.

In the SiC-MOSFET, a source-side parasitic diode Ds and a drain-side parasitic diode Dd are formed respectively between the P-well region 3 and the $N^+$-type region 8, and between the P-well region and the $N^+$-type source plate 1 (drain electrode). Accordingly, if the drain electrode D is connected to the positive terminal of a battery and the source electrode S is connected to any one of armature coils, back-flow current may flow from the battery to the armature coil through the source-side parasitic diode. Therefore, the P-well region 3 and the source electrode S are short-circuited so that the parasitic diode Dd interrupts the back-flow current. The above structure is applied to the P-type SiC-MOSFET in the same manner.

Figure 4:
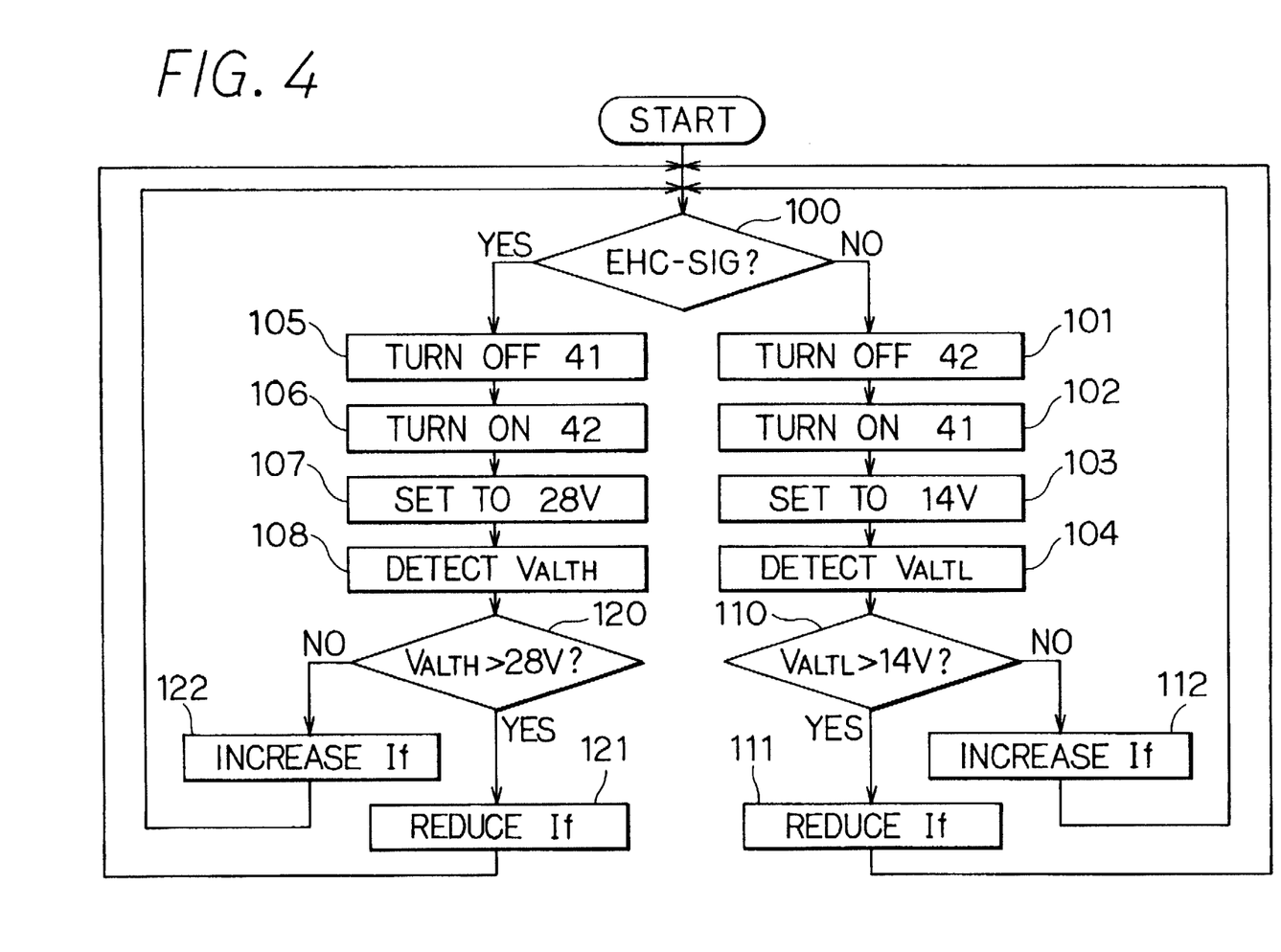
FIG. 4 is a flow chart showing the operation of a microcomputer.

The microcomputer 70 executes a computer program according to a flow chart shown in FIG. 4 to duty-control each of the SiC-MOSFETs 41 and 42 and the field coil 20. The computer program is stored in a ROM of the microcomputer 70.

The rectifying unit 30, the semiconductor switching circuit 40 and the microcomputer 70 are disposed in the housing 10a of the alternator G as described hereafter with reference to FIG. 3.

The rectifying unit 30 is composed of cooling fins Pa and Pb and diodes 31–36 and are disposed on the alternator stator at an end of the housing 10a of the alternator G opposite a cooling fan fixed to the alternator rotor (not shown). A common terminal a of the diodes 31 and 34, a common terminal b of the diodes 32 and 35 and a common terminal c of the diodes 33 and 36 are respectively located at fastening bolts as shown in FIG. 3.

The semiconductor switching circuit 40 is fixed to a cooling fin 40a which is fixed to an outer end portion of the housing 10a by bolts to be cooled by the cooling fin 40a.

The microcomputer 70 is fixed to a cooling fin 70a at the stator side and cooled by the cooling fin 70a. The cooling fin 70a is fixed to an outer end portion of the housing 10a beside the cooling fin 40a as shown in FIG. 3.

The cooling fan is rotated by the rotor to send air to the stator. Thus, the rectifying unit 30, the cooling fins 40a and 70a, a brush unit 10b, the stator and the rotor are cooled by the cooling fan.

The source terminal S of the SiC-MOSFET 41 of the semiconductor switching circuit 40 is connected to the low-voltage load 50 through an outer terminal e, and the source terminal of the SiC-MOSFET 42 is connected to the high-voltage load through the outer terminal d.

A terminal f of the microcomputer 70 is connected to the field coil 20, and an input terminal thereof is connected to an outer terminal e through a connecting wire 71. An input terminal g of the microcomputer is connected to the outer terminal d through a connecting wire 72, and input terminals h and i of the microcomputer 70 are connected to respective SiC-MOSFETs 42 and 41 through respective connecting wires 73 and 74.

In the first embodiment described above, when an ignition switch is operated to start the engine and the power supply system, the microcomputer starts to execute the computer program according to the flow chart shown in FIG. 4.

In a step 100, a signal of the EHC sent from an engine ECU (not shown) is examined. The signal of the EHC is generated by the engine ECU for a few seconds after the ignition switch is turned on to command driving of the high-voltage load 60. The alternator G is driven by the engine and generates electric power.

If the signal of the EHC is not sent from the engine ECU, NO is determined in the step 100. Then, the SiC-MOSFET 42 of the semiconductor switching circuit 40 is turned off and the SiC-MOSFET 41 is turned on respectively in steps 101 and 102.

In a step 103, a first control voltage to energize the low-voltage load 50 is set to 14 V, and battery voltage as a low-output voltage $V_{ALTL}$ is detected through the connecting wire 71 from the battery Ba in the next step 104.

If the low-output voltage $V_{ALTL}$ is higher than the control voltage 14 V, YES is determined in a step 110, and the field current If supplied to the field coil 20 is reduced in a step 111. On the other hand, if the determination is NO in the step 110, the field current If is increased in a step 112.

Thus, the alternator G generates output voltage according to the field current If. Therefore, the output voltage of the alternator G is rectified by the three-phase full-wave rectifying unit 30 to be supplied to the battery Ba and the low-voltage load 50 through the SiC-MOSFET 41 as the control voltage 14 V.

On the other hand, when the signal of the EHC is sent from the engine ECU, YES is determined in the step 100. Subsequently, the SiC-MOSFET 41 of the semiconductor switching circuit 40 is turned off and the SiC-MOSFET 42 is turned on in the steps 105 and 106, respectively.

Thereafter, in a step 107, a second control voltage 28 V is set to energize the high-voltage load, and a high-output voltage $V_{ALTH}$ is detected from the high-voltage load 60 through the connecting wire 72 by the microcomputer 70 in the next step 108.

If the high-output voltage $V_{ALTH}$ is higher than 28 V, YES is determined in a step 120 and the field current If is reduced in a step 121. On the other hand if NO is determined in the step 120, the field current If is increased in a step 122.

Thus, the alternator G generates the output voltage according to the field current If. Accordingly, the output voltage of the alternator G is rectified by the full-wave three-phase rectifying unit 30 and supplied to the high-voltage load through the SiC-MOSFET 42 as the second control voltage 28 V. As a result, the high-voltage load 60 increases the temperature of the catalytic converter to accelerate the exhaust gas control.

The output power of the alternator G generally increases as the output voltage increases to a certain voltage. Accordingly, if the alternator G is driven to generate a maximum power, a large amount of power can be supplied to the high-voltage load without an increase of the size of the alternator G.

As described above, in the first embodiment, semiconductor switching circuit 40 and the microcomputer 70, as well as the rectifying unit 30, are disposed in the housing 10a.

As a result, the wires connecting the rectifying unit 30 and the semiconductor switching circuit 40, that is a wire harness connecting the armature coils of the alternator G and the semiconductor switching circuit 40 can be made shorter. Therefore, a wire harness having a large diameter used in the conventional system for the low-voltage load is remarkably reduced, thereby reducing cost.

Since the wire harness connecting the armature coils of the alternator G and the semiconductor switching circuit 40 is remarkably reduced, the wiring of the wire harness becomes easy.

Since the microcomputer 70 controls currents of the field coil 20 and the SiC-MOSFETs 41 and 42, a specific control circuit for the SiC-MOSFETs 41 and 42 is not necessary.

Since those units are disposed in the housing 10a, connecting portions of the power supply system as a whole are reduced so that such a trouble as disconnection of the wire harness can be prevented, thereby improving reliability of the power supply system.

In addition, since the microcomputer 70 and the semiconductor switching circuit 40 are cooled by the cooling fan of the alternator G via the cooling fins 70a and 40a, an extra cooling unit for the microcomputer 70 and the semiconductor switching circuit 40 is not necessary, thereby reducing the cost of the power supply system.

Since the SiC-MOSFETs 41 and 42 used in the semiconductor switching circuit 40 have characteristics of lower loss, higher voltage resistance and higher temperature resistance than Si-made switching elements, reliability of the power supply system can be improved further.

As described above, both drain terminals D of the SiC-MOSFETs 41 and 42 are connected to the high-voltage terminal of the rectifying unit 30, the source terminals S of the SiC-MOSFET 41 is connected to the low-voltage load 50 and the high-voltage terminal of the battery Ba and the source terminals S of the SiC-MOSFET 42 is connected to the high-voltage load 60.

As a result, there is no possibility that a high voltage is applied to the battery Ba through the parasitic diodes of the SiC-MOSFETs 41 and 42 when the alternator G generates 28 V, and that unnecessary current is supplied to the high-voltage load when the alternator G generates 14 V.

Figure 5:
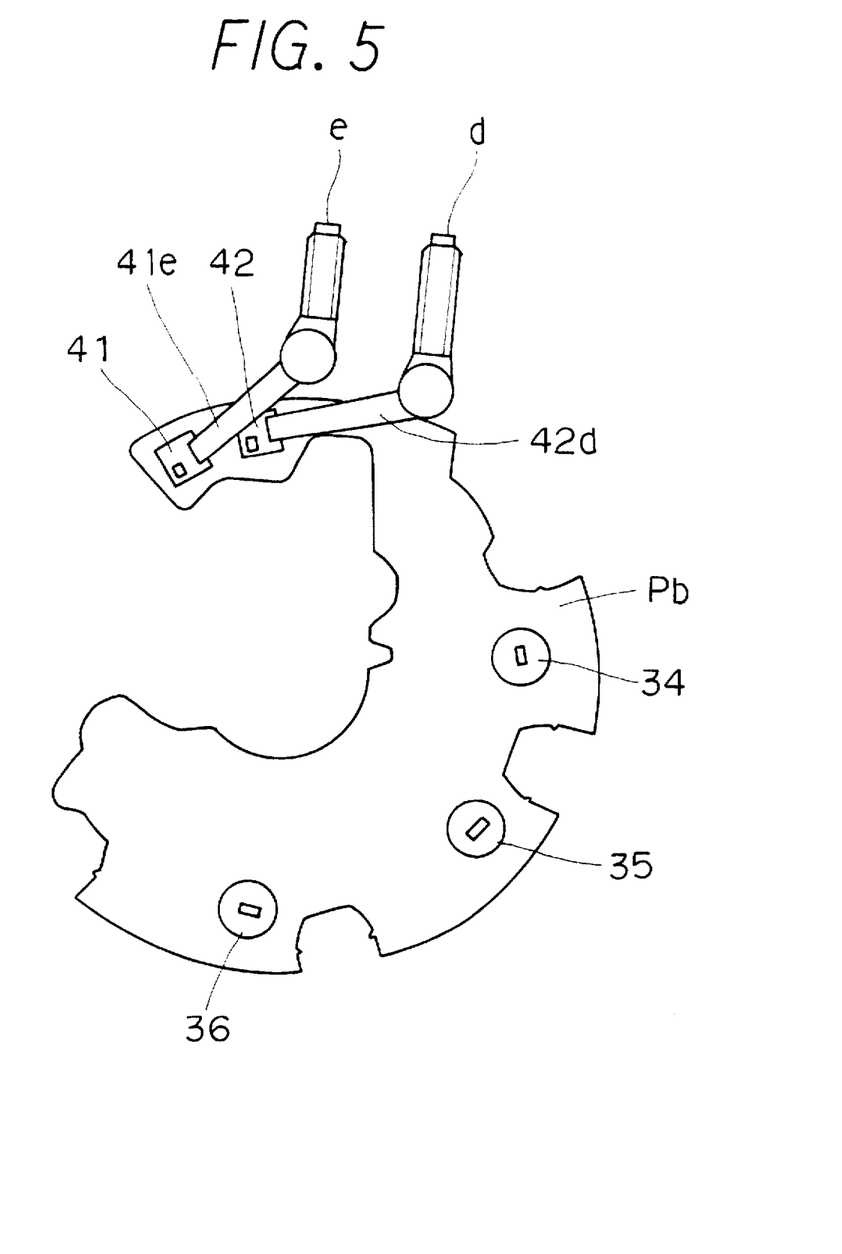
FIG. 5 is a plan view illustrating a main portion of a variation of the first embodiment.

FIG. 5 shows a variation of the first embodiment.

In the variation, the drain electrodes of the SiC-MOSFETs 41 and 42 described with regard to the first embodiment are soldered to the surface of the positive-side cooling fin Pb for the diodes 34–36 of the rectifying unit 30.

The source terminal S of the SiC-MOSFET 41 is connected to the outer terminal e through a lead 41e and to the low-voltage load 50. On the other hand, the source terminal S of the SiC-MOSFET 42 is connected to the outer terminal d through an electrode 42d and to the high-voltage load 60. Since the electrodes 41e and 42d are different in height (in the vertical direction of the drawing) from each other, they do not get into contact with each other.

The SiC-MOSFETs 41 and 42, the leads 41e and 42d and gate electrodes (not shown) are molded with resinous material to be protected from the atmosphere. The remaining structure is the same as that of the first embodiment.

A second embodiment of the present invention is described with reference to FIG. 6–FIG. 12 next.

Figure 6:
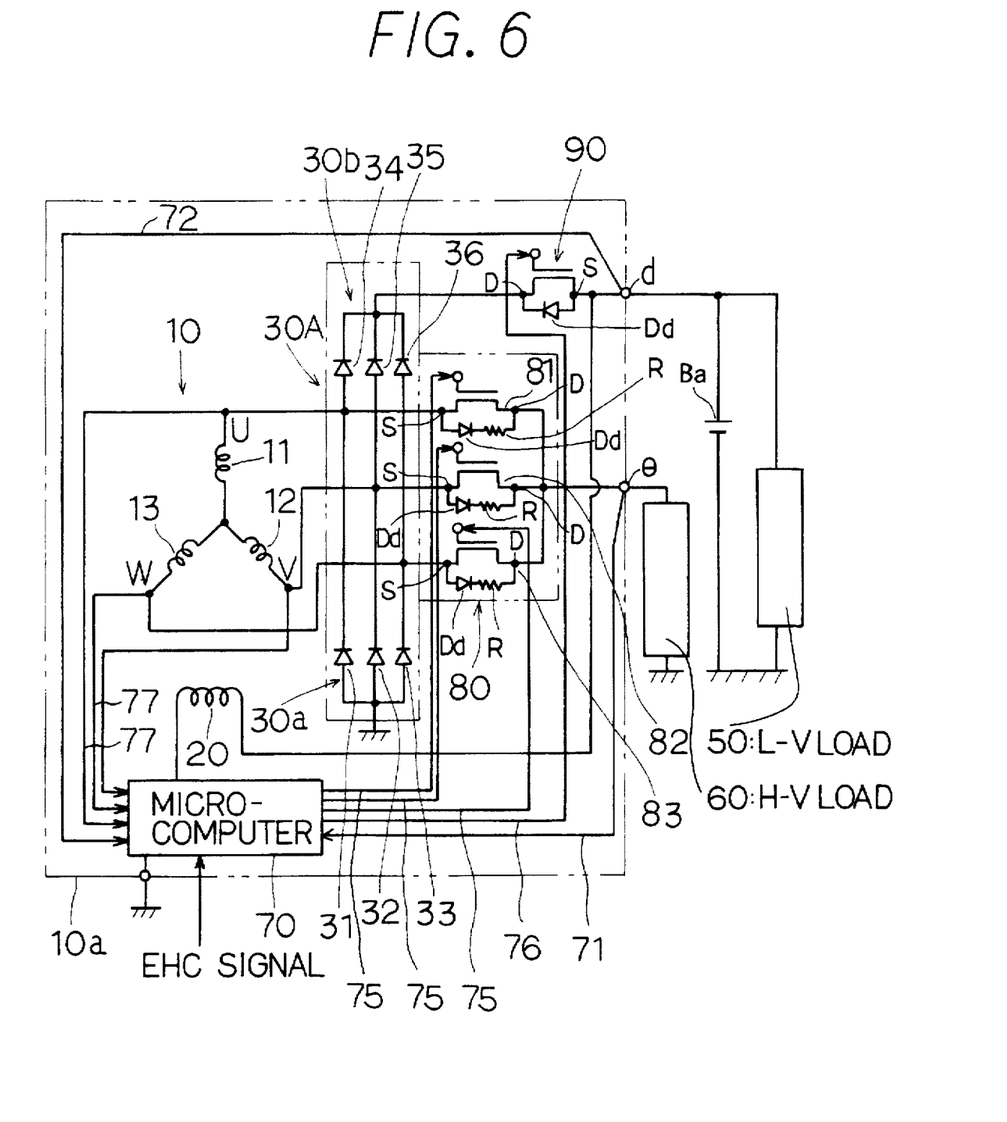
FIG. 6 is an electric circuit diagram of a second embodiment of the present invention.

In the second embodiment, a SiC-MOSFET 90 is used instead of the semiconductor switching circuit 40 of the first embodiment, and a rectifying unit 30A is used instead of the rectifying unit 30 of the first embodiment.

A SiC-MOSFET 90 has the same structure as the SiC-MOSFET 41 of the first embodiment and has the source terminal S connected to a ground through the low-voltage load 50 and the drain terminal D connected to cathodes of the diodes 34–36 of the high-side half bridge circuit 30b respectively.

The SiC-MOSFET 90 is controlled by the microcomputer 70 to function as a switch.

The rectifying unit 30A has a high-side half-bridge circuit 80 in addition to the rectifying unit 30 of the first embodiment. The high-side half-bridge circuit 30b composes the three-phase full-wave rectifying circuit for the low-voltage load 50 with the low-side half-bridge circuit 30a.

The high-side half-bridge circuit 80 is composed of SiC-MOSFETs 81–83 with the low-side half-bridge 30a, and forms a three-phase full-wave rectifying circuit for the high-voltage load 60. Each one of the drain terminals D of the SiC-MOSFETs 81–83 is connected to a ground through the high-voltage load 60 and each one of the source terminals S of the SiC-MOSFETs 81–83 is connected to corresponding one of the armature coils 11–13.

Figure 7:
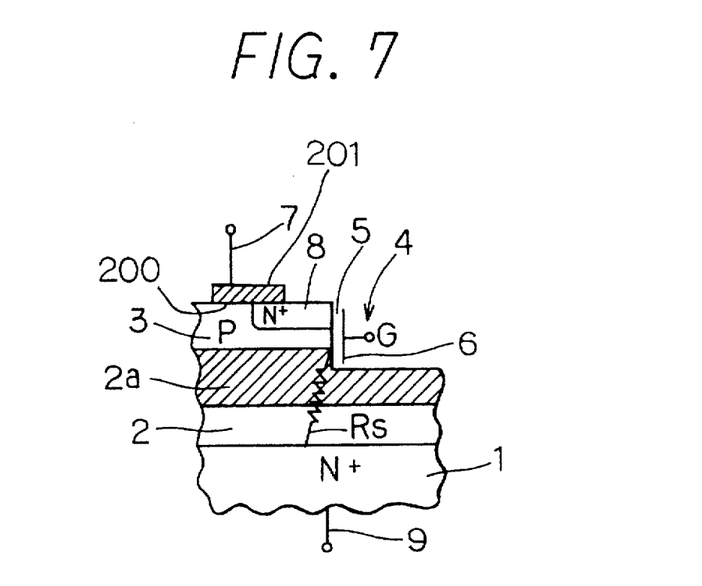
FIG. 7 is a cross-sectional side view illustrating a main portion of a SiC-MOSFET shown in FIG. 6.

An example of the structure of the SiC-MOSFETs 81–83 is described with reference to FIG. 7, which shows an N-channel type.

As described with regard to the first embodiment and shown in FIG. 2, the gate electrode 6 made of doped poly-silicon is formed on the trench 4 and, subsequently, the field insulation layer (not shown) is removed by the photolithography. Thereafter, the nickel electrode 201 is brought in contact with the $N^+$ type region 8 (source terminal S) and the P-well region 3, and the metal electrode 9 is brought in contact with a surface of the $N^+$ type plate 1 (drain electrode D) as shown in FIG. 7. Thus, the SiC-MOSFET is formed.

The nickel electrode 201 is formed by spattering or vacuum evaporation, and a layer of high-resistance metal alloy of nickel and SiC is formed as a high-resistance resistor 200 between the nickel electrode 201 and the P-well region 3.

The equivalent circuits of the SiC-MOSFETs 81–83 are shown in FIG. 6. In the SiC-MOSFET 81, a series circuit of the drain side parasitic diode Dd and the high resistance resistor 200 is formed between the P-well region 3 and the $N^+$ type region 8 (source S) and between the former and the $N^+$ type plate 1 (drain electrode D).

Accordingly, the parasitic diode Ds prevents back flow current add the resistor R prevents forward flow of the parasitic diode Dd. The above function is applied to the P-type SiC-MOSFET in the same manner.

Figure 9:
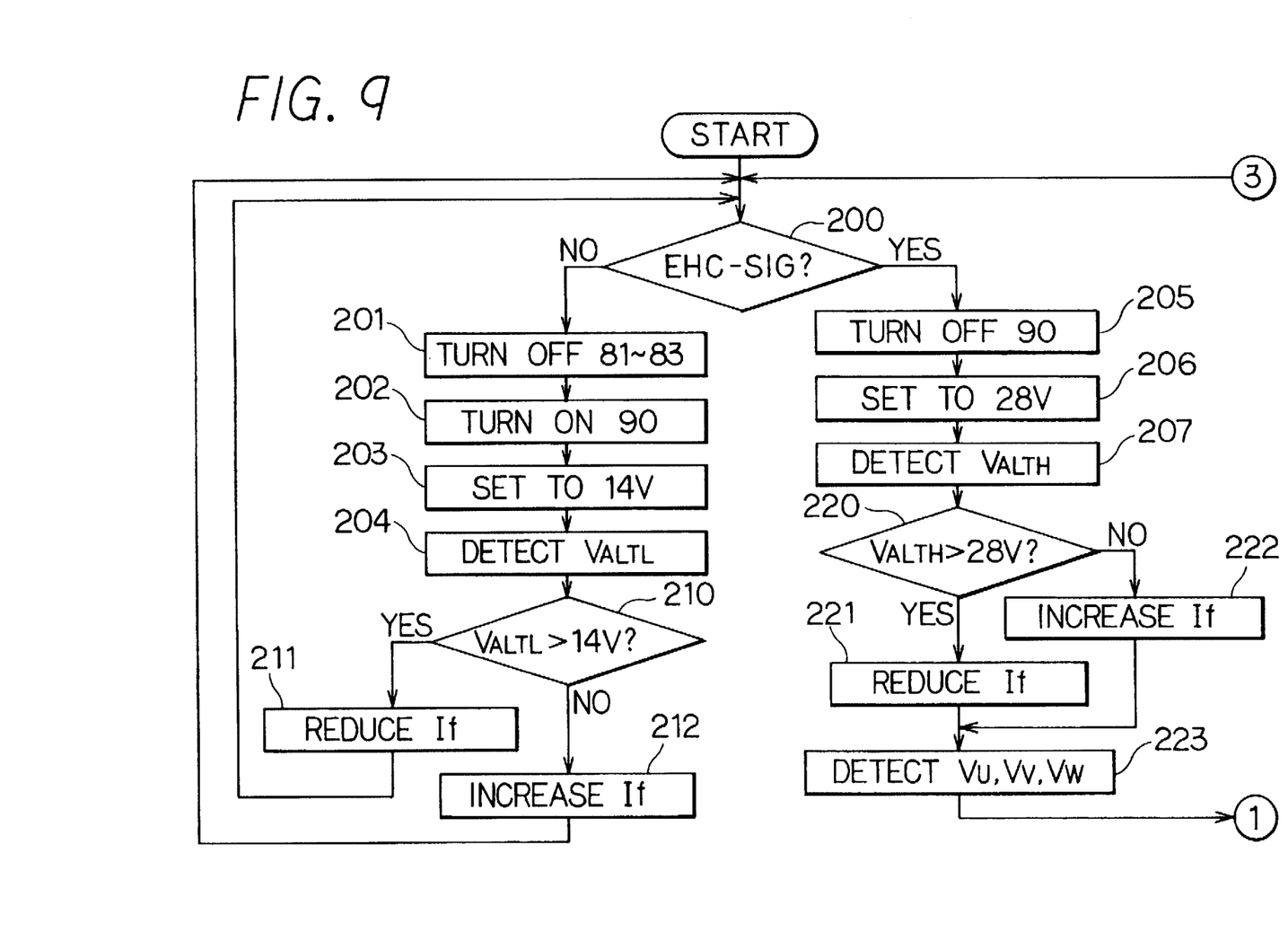
FIG. 9 is a flow chart showing a former part of operation of the microcomputer.
Figure 10:
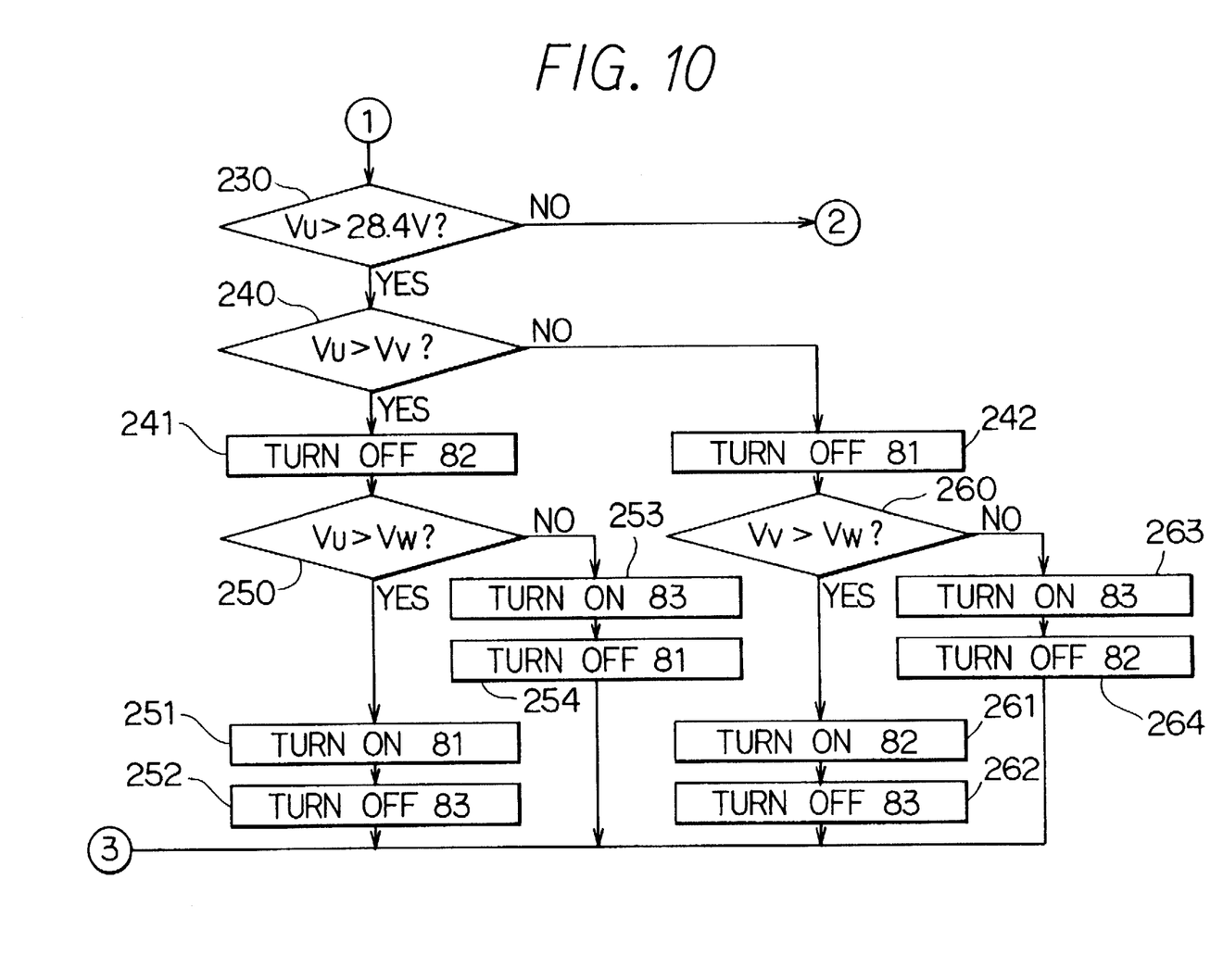
FIG. 10 is a flow chart showing a middle part of the same.
Figure 11:
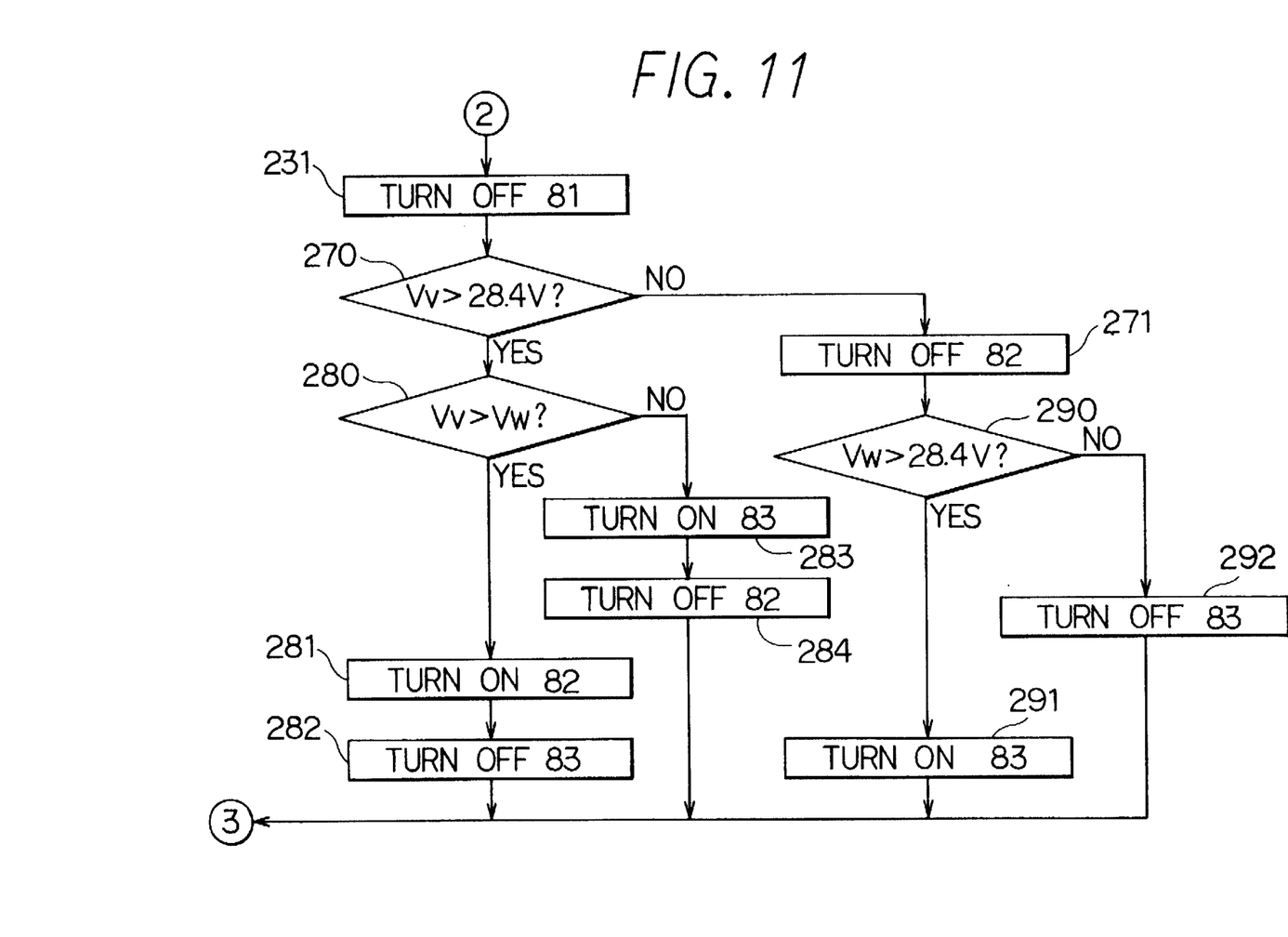
FIG. 11 is a flow chart showing a latter part of the same.

The microcomputer 70 executes the computer program according to a flow chart shown in FIG. 9–FIG. 11 instead of the flow chart for the first embodiment shown in FIG. 4.

Figure 8:
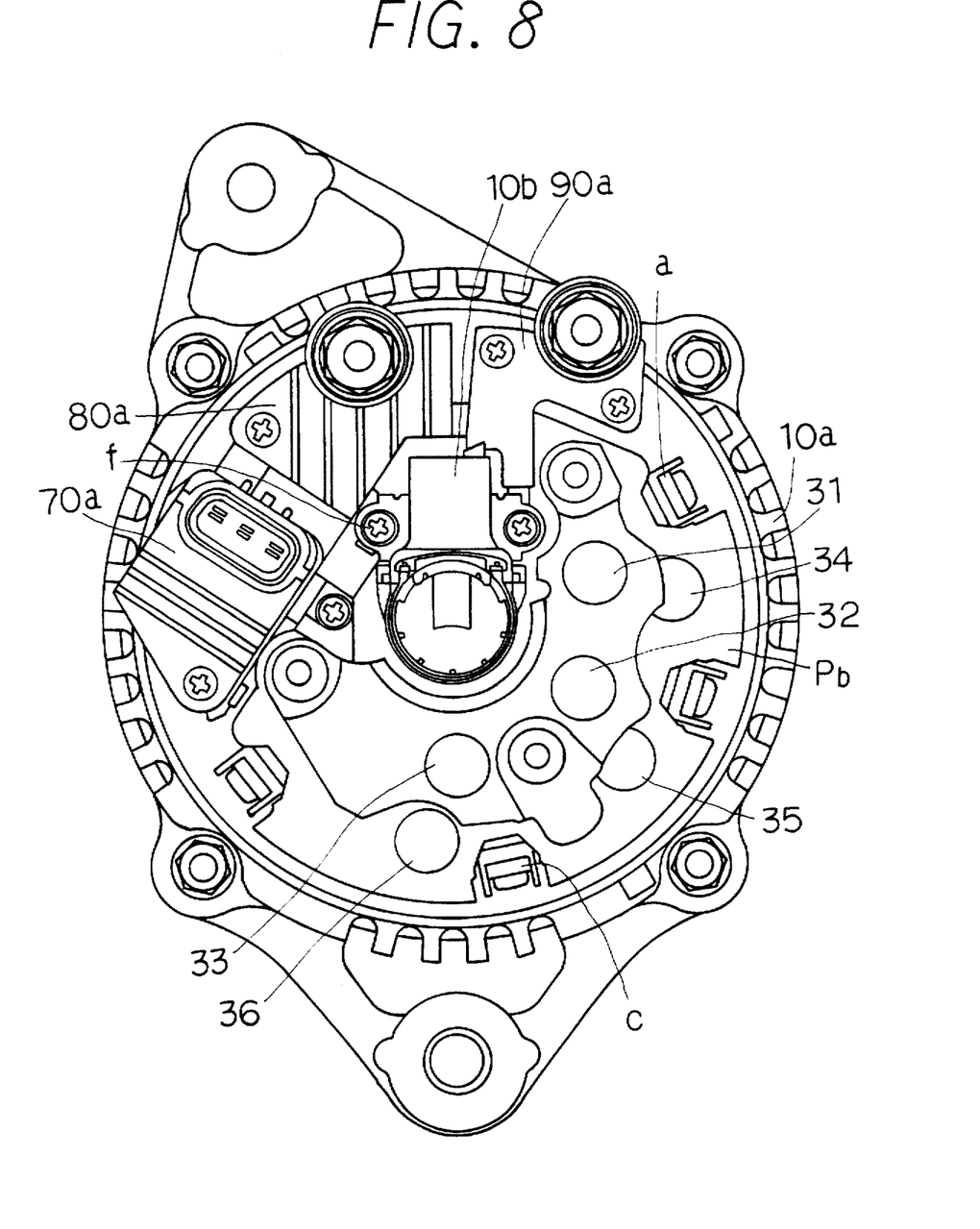
FIG. 8 is a schematic front view illustrating an arrangement of a rectifying unit, a semiconductor switching circuit and a microcomputer disposed in a housing of an alternator shown in FIG. 6.

In the second embodiment, the high-side half-bridge circuit 80 is fixed to a cooling fin 80a disposed on the outer end surface of the housing 10a at the armature side instead of the cooling fin 40a of the first embodiment.

The microcomputer 70 is connected at the output terminals thereof to the gate terminals of the SiC-MOSFETs 81–83 through respective connecting wires 75, and to the gate terminal of the SiC-MOSFET 90 through a connecting wire 76. The microcomputer 70 is connected at the input terminals thereof to the armature coils 11–13 through connecting wires 77 respectively. The remaining structure is the same as the first embodiment.

In the second embodiment described above, when the microcomputer 70 executes the computer program according to the flow charts shown in FIG. 9–FIG. 11, presence of the EHC signal sent from the engine ECU (not shown) is detected in a step 200. This step decides whether to energize the high voltage load.

If the EHC signal is not sent from the engine ECU, NO is determined in the step 200. Subsequently, the respective SiC-MOSFETs 81–83 of the high-side half-bridge 80 are turned off and the SiC-MOSFET 90 is turned on in steps 201 and 202 respectively, so that the battery Ba and the low-voltage load 50 are energized.

Thereafter, the first control voltage is set to 14 V in a step 203, and the low-voltage-side output voltage $V_{ALTL}$ is detected through the connecting wire 72 from the battery voltage Ba in a step 204.

If the low-voltage-side output voltage $V_{ALTL}$ is higher than the first control voltage 14 V, YES is determined in a step 210, and the field current If of the field coil is reduced in a step 211. On the other hand, if NO is determined in the step 210, the field current If is increased in a step 212.

Thus, the alternator G generates the output voltage according to control of the field current If. Accordingly, the output voltage of the alternator G is rectified by the low-side half-bridge circuit 30a and the high-side half-bridge circuit 30b and supplied to the battery Ba and the low-voltage load 50 as the first control voltage through the SiC-MOSFET 90.

On the other hand, if YES is determined in the step 200 (to energize the high-voltage load), the SiC-MOSFET 90 is turned off to cut current supply to the battery Ba and the low-voltage load 50 in a step 205. Subsequently, the second control voltage is set to 28 V in a step 206 and the high-voltage-side output voltage $V_{ALTH}$ is detected from the high-voltage load 60 through the connecting wire 71 in the next step 207.

If the high-voltage-side output voltage $V_{ALTH}$ is higher than 28 V, YES is determined in a step 220, and the field current If is reduced in a step 221. On the other hand, if NO is determined in the step 220, the field current If is increased in a step 222.

Thus the alternator G generates the output voltage according to control of the field current If.

As described above, when the step 221 or 222 is executed, the phase voltages Vu, Vv and Vw of the armature coils 11–13 are detected through the connecting wires 77 respectively. In the meantime, the armature windings 11, 12 and 13 correspond to the U-phase, V-phase and W-phase windings respectively.

After the step 223, if the phase voltage Vu is higher than 28.4 V and other phase voltages Vv and Vw, YES is determined in the following steps 230, 240, 250, the SiC-MOSFET 82 is turned off in a step 241, the SiC-MOSFET 83 is turned off in a step 252, and the SiC-MOSFET 81 for the U-phase voltage Vu is turned on in a step 251 according to a flow chart shown in FIG. 10.

Thereafter, if NO is determined in the step 230, the SiC-MOSFET 81 is turned off in a step 231 (see FIG. 11). In the meantime, 28.4 V is a value given by adding voltage drop (0.4 v) of either the SiC-MOSFETs 81–83 to the second control voltage (28 V).

If NO is determined in the step 240, SiC-MOSFET 81 is turned off in a step 242. If the phase voltage Vv is higher than the phase voltage Vw, YES is determined in a step 260, and the SiC-MOSFET 82 for the V-phase voltage is turned on in a step 261, and SiC-MOSFET 83 is turned off in a step 262. If NO is determined in the step 260, the SiC-MOSFET 83 for the W-phase voltage is turned on in a step 263 and the SiC-MOSFET 82 is turned off in a step 264.

If NO is determined in the step 250, the SiC-MOSFET 83 is turned on in a step 253 and the SiC-MOSFET 81 is turned off in the following step 254.

When the SiC-MOSFET 81 is turned on and if the V-phase voltage Vv is higher than 28.4 V and higher than the phase voltage Vw, YES is determined in steps 270 and 280, the SiC-MOSFET 82 is turned on in a step 281, the SiC-MOSFET 83 is turned off in a step 282 according to the flow chart shown in FIG. 11. Thereafter, if NO is determined in the step 270, the SiC-MOSFET 82 is turned off in a step 271.

Accordingly, the SiC-MOSFET 82 is turned on if the phase voltage Vv is higher than 28.4 V. In this case, if NO is determined in the step 280, the SiC-MOSFET 83 is turned on in a step 283, and the SiC-MOSFET 82 is turned off in the next step 284.

When both SiC-MOSFET 81 and 82 are turned off and if the phase voltage Vw is higher than 28.4 V, YES is determined in a step 290 and the SiC-MOSFET 83 is turned on in a step 291. Thereafter, if NO is determined in the step 290, the SiC-MOSFET 83 is turned off in a step 292.

Thus, the SiC-MOSFET 83 is turned on if the phase voltage Vw is higher than 28.4 V.

Figure 12:
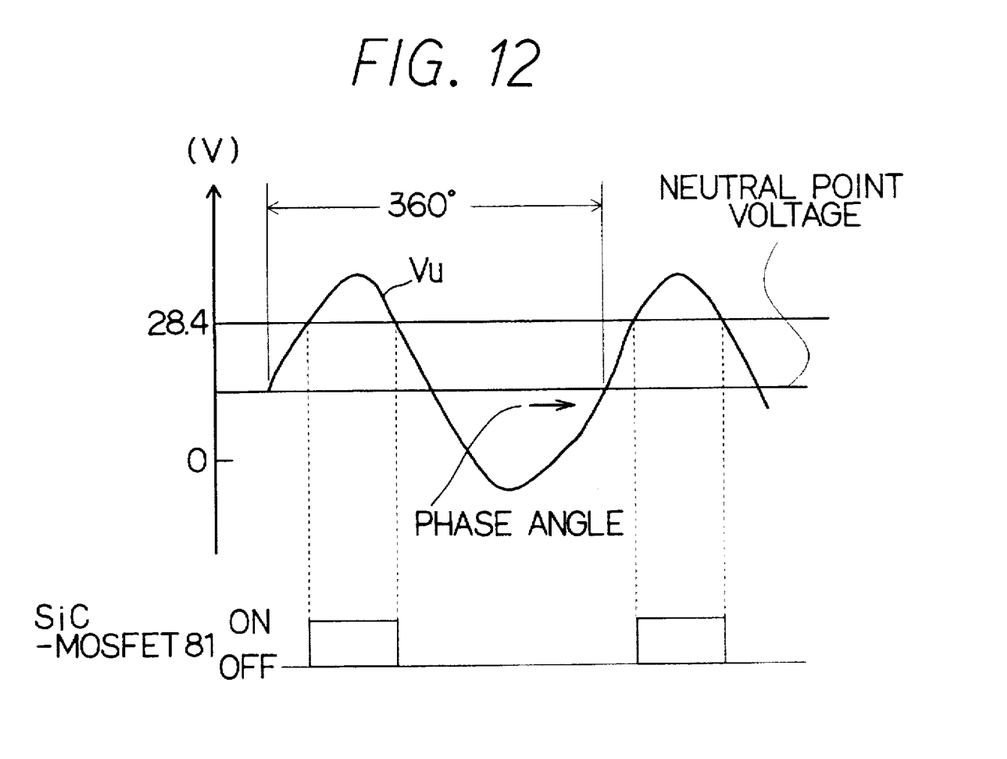
FIG. 12 is a time chart of U-phase voltage of the alternator showing on-off time of the SiC-MOSFET shown in FIG. 6.

FIG. 12 shows how the SiC-MOSFET 81 for the U-phase voltage Vu is turned on and off with respect to the control voltage.

The SiC-MOSFETs of the high-side half-bridge circuit 80 are PWM-controlled sequentially to full-wave-rectify the three-phase output voltage of the alternator G with the low-side half-bridge circuit 30a so that the second control voltage 28 V is supplied to the high-voltage load 60. As a result, the high-voltage load 60 raises the temperature of the catalytic converter to accelerate control of the exhaust gases.

As described above, SiC-MOSFETs 81–83 are adopted as semiconductor switching elements to rectify the output voltage of the alternator G.

Since these SiC-MOSFETs 81–83 are made of SiC which has characteristics of lower loss, higher voltage resistance and higher temperature resistance than those characteristics of Si, reliability of the power supply system is improved.

Since the SiC-MOSFETs of the high-side half-bridge 80 have the series circuit of the parasitic diodes Dd and the high resistance resistor 200, the following effects can be expected.

That is, when the alternator G generates 14 V, unnecessary current flows through the parasitic diode from the alternator G to the high-voltage load 60.

Since, in the second embodiment, the SiC-MOSFETs of the high-side half-bridge circuit 80 have the series circuits of the parasitic diode and the high-resistance resistor, the back-flow current is interrupted by the parasitic diode, so that satisfactory switching of the voltages can be achieved, and the SiC-MOSFETs of the high-side half-bridge circuit 80 can be connected without attention to the polarity.

Figure 13:
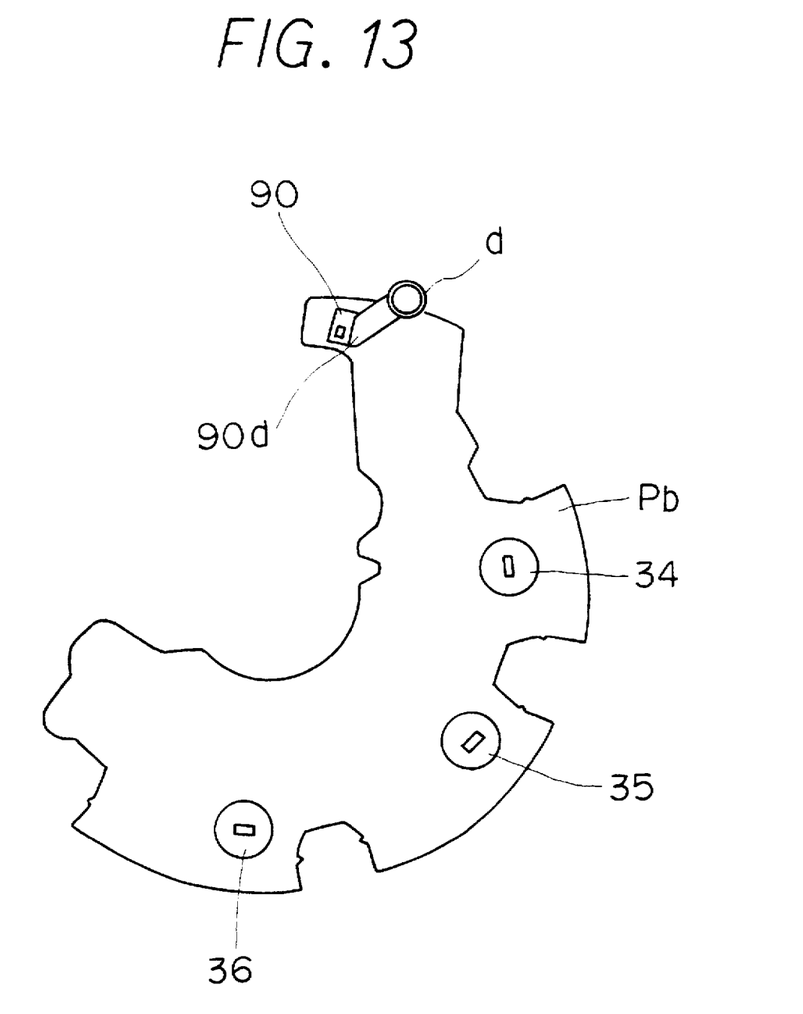
FIG. 13 is a plan view of a main portion of a first variation of the second embodiment.

FIG. 13 shows a first variation of the second embodiment.

The drain electrode D of the SiC-MOSFET 90 (which is described in regard to the second embodiment) of first variation is soldered to the positive-side cooling fin Pb for the diodes 34–36 of the rectifying unit 30A.

The source electrode of the SiC-MOSFET 90 is connected to the outer terminal d through a lead 90d and to the low-voltage load 50.

In the mean time, the SiC-MOSFET 90, the electrode 90d and the gate electrode (not shown) are molded with resinous material to be protected from the atmosphere. Other structure is the same as the second embodiment.

Figure 14:
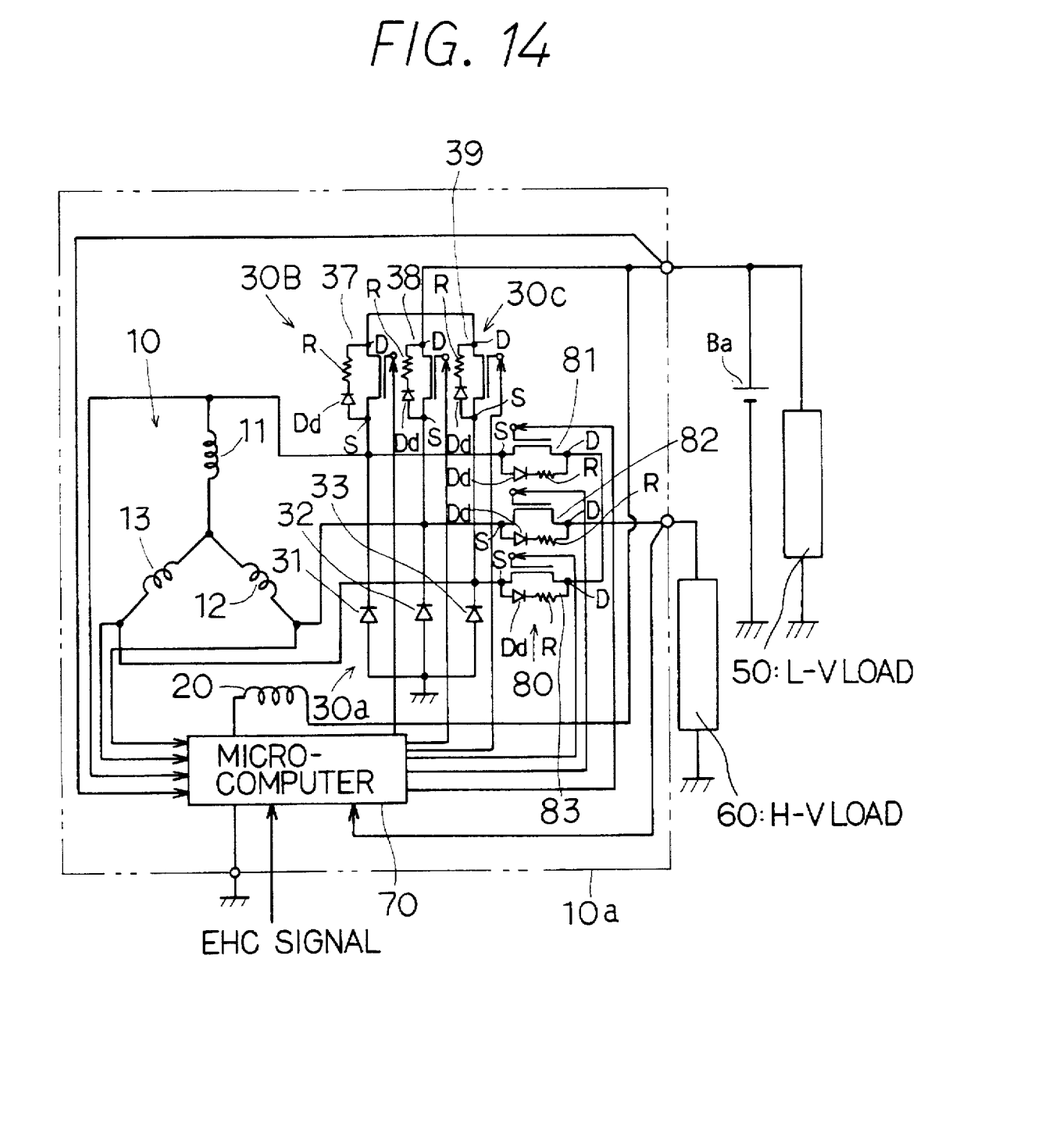
FIG. 14 is an electric circuit diagram showing a second variation of the second embodiment.

A second variation of the above second embodiment is described with reference to FIG. 14.

In the second variation, the SiC-MOSFET 90 described in regard to the second embodiment is omitted, and the rectifying unit 30A is replaced by a rectifying unit 30B.

The rectifying unit 30B is almost the same as the rectifying unit 30A except that a high-side half-bridge circuit 30b is replaced by a high-side bridge-circuit 30c.

The high-side half-bridge circuit 30c has SiC-MOSFETs 37–39 which have the same structure as the SiC-MOSFETs 81–83 of the high-side half-bridge circuit 80, and the high-side half-bridge circuit 30c forms a low-voltage-load-side three-phase full-wave rectifying circuit with the low-side half-bridge circuit 30a. The high-side half-bridge circuit 30c of this variation is fixed to the cooling fin 30c in place of the high-side half-bridge 30b.

Each one of the SiC-MOSFETs 37–39 is connected at the drain terminal D thereof to a ground through the low-voltage load 50 and at the source terminal S thereof to one of the armature coils 11–13.

The microcomputer 70 executes a computer program according to a flow chart which has steps for PWM-controlling the SiC-MOSFETs 37–39 in addition to the flow chart shown in FIG. 9–FIG. 11.

The additional steps (not shown) for PWM-controlling the SiC-MOSFETs 37–39 are added so that the SiC-MOSFETs 81–83 can be controlled according to the flow charts shown in FIG. 10 and FIG. 11 after all the SiC-MOSFETs 37–39 are turned off when the high-voltage load is energized, and so that the SiC-MOSFETs 37–39 can be controlled after all the SiC-MOSFETs 81–83 are turned off when the low-voltage load is energized.

In addition, a reference voltage 14.4 V is adopted instead of 28.4 V. Other structure is the same as the second embodiment. In the mean time the above 14.4 V is a value given by adding the voltage drop (0.4 V) of any one of the SiC-MOSFETs 37–39 to the first control voltage 14 V.

In the above second variation, when the low-voltage load 50 and the battery Ba are energized, the SiC-MOSFETs 37–39 are PWM-controlled as follows after the SiC-MOSFETs 81–83 are turned off.

As in the second variation after the step 223, if the phase voltage Vu is higher than 14.4 V (reference voltage 14.4 V is adopted instead of 28.4 V shown in FIG. 10 and FIG. 11) and the phase voltages Vv and Vw, the SiC-MOSFETs 38 and 39 are turned off and the SiC-MOSFETs 37 is turned on.

Thereafter, when the phase voltage Vu becomes lower than 14.4 V , the SiC-MOSFETs 37 is turned off.

Thus, the SiC-MOSFETs 37 is turned on if the phase voltage Vu becomes higher than 14.4 V.

When the SiC-MOSFETs 37 is turned off and the phase voltage Vv becomes higher than 14.4 V and higher than the phase voltage Vw, the SiC-MOSFETs 38 is turned on and the SiC-MOSFETs 39 is turned off. Thereafter, when the phase voltage Vv becomes lower than 14.4 V, the SiC-MOSFETs 38 is turned off.

Thus, the SiC-MOSFETs 38 is turned on when the phase voltage Vv becomes higher than 14.4 V.

When both SiC-MOSFETs 37 and 38 are turned off and the phase voltage Vw is higher than 14.4 V, the SiC-MOSFETs 39 is turned on. Thereafter, if the phase voltage Vw becomes lower than 14.4 V, the SiC-MOSFETs 39 is turned off.

Thus, the SiC-MOSFETs 37–39 of the high-side half-bridge circuit 30c are sequentially PWM-controlled to three-phase-full-wave-rectify the three-phase output voltage of the alternator G with the low-side half-bridge circuit 30a to supply the low-voltage load 50 and the battery Ba with the first control voltage 14 V, resulting in improvement of battery charging performance.

In this case, each one of the SiC-MOSFETs 37–39 of the high-side half-bridge circuit 30c has the series circuit of the parasitic diode Dd and the high-resistance resistor 200. As a result, when the high-voltage load 60 is energized at 28 V, there is no possibility that the high voltage 28 v is applied to the battery through the parasitic diode Dd, or the output current of the alternator G flows backward through the high-side half-bridge 30c.

Since adoption of the SiC-MOSFETs of the high-side half-bridge circuit 30c can omit the SiC-MOSFETs 90 of the second embodiment, the number of parts of the power supply system can be reduced.

In the above embodiments and the variations, if 14 V is applied to the low-voltage load 50 by PWM-controlling the SiC-MOSFETs 42, 90 and 37–39 when the alternator G generates the high voltage, the low-voltage load 50 can be energized at the same time, resulting in improvement of charging battery.

Particularly, when the PWM-control is carried out in the second embodiment, there is no possibility that the high voltage is applied to the battery Ba or the low-voltage load 50 when the SiC-MOSFETs are turned off since the parasitic diodes interrupt the back current, thereby preventing troubles of the battery over-charge and breakdown of the low-voltage load.

In addition, since high-speed switching characteristic of the SiC-MOSFETs 81–83 and 37–39 is satisfactory, the PWM-control is performed even if the alternator G rotates at a high speed.

Since the diodes 21–23 of the low-side half-bridge circuit 30a are made of SiC, they are high temperature resistible and need not to be cooled, resulting in a simple structure and a compact power supply system.

Instead of the SiC-MOSFETs 81–83 and 37–39, MOSFETs which have series circuits of the parasitic diode and the high-resistance resistor can be used to have the same effects as the SiC-MOSFETs.

The high-voltage load 60 is not limited to the heater of the catalytic converter, and can be a heater of the windshield glass.

The alternator G is not limited to the three-phase but can be applied to multi phase alternator.

The steps of the flow charts for the above embodiments can be embodied into a hardlogic structure.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. An electric power supply system for supplying power to a battery at a battery voltage and to a high-voltage electric load of a vehicle at a voltage higher than said battery voltage in response to a command signal, said electric power supply system comprising:

an alternator having a housing, a multi-phase armature winding, a field current supply circuit including a field coil and at least a first and a second output terminals respectively connected to said battery and said high-voltage electric load, and a rectifying unit connected between said armature winding;

switching means disposed in said housing and having at least two SiC-MOSFETs, wherein at least one of said SiC-MOSFETs is connected between said armature winding and each of said output terminals; and control means, disposed in said housing and connected to said switching means and said field coil, for controlling said switching means and said field current supply circuit such that rectified output power from said rectifying unit is selectively supplied to said battery and said high-voltage load in response to said command signal.

2. An electric power supply system for a vehicle according to claim 1, wherein said SiC-MOSFETs of said switching means define a part of said rectifying unit.

3. An electric power supply system for a vehicle according to claim 1, wherein each of said SiC-MOSFETs has a P-well region and $N^+$ region and a series circuit of a parasitic diode and a high resistance conductor connected between said P-well region and $N^+$ region.

4. An electric power system for a vehicle according to claim 2, wherein said rectifying unit comprises a low-side half-bridge circuit and a high-side half-bridge circuit, and said high-side half-bridge circuit is composed of said SiC-MOSFETs.

5. An electric power supply system for supplying power to a battery at a battery voltage and to a high-voltage electric load of a vehicle at a voltage higher than said battery voltage, said electric power supply system comprising:

an alternator having a housing, a multi-phase armature winding, a field coil, a first and a second rectifying unit connected to said armature coil, a first output terminal connected to said battery and a second output terminal connected to said high-voltage electric load;

a first SiC-MOSFET switching element disposed in said housing and connected between said first rectifying unit and said first output terminal;

a second SiC-MOSFET switching element disposed in said housing and connected between said second rectifying unit and said second output terminal; and control means, connected to said first and said second SiC-MOSFET switching elements, for controlling said first and said second SiC-MOSFET switching elements such that said battery voltage is selectively supplied to said battery and such that said voltage higher than said battery voltage is selectively supplied to said high-voltage electric load.

6. An electric power supply system for a vehicle according to claim 5, wherein at least one of said first and said second SiC-MOSFET switching elements define a part of a corresponding one of said first and said second rectifying units.

7. An electric power supply system for supplying power to a battery at a battery voltage and for supplying to a high-voltage electric load of a vehicle a voltage higher than said battery voltage in response to a command signal, said electric power supply system comprising:

an alternator having a housing, a multi-phase armature winding, a field current supply circuit including a field coil and at least a first and a second output terminal respectively connected to said battery and high-voltage electric load, and a rectifying unit connected between said armature winding;

switching means disposed in said housing and connected between said rectifying unit and each of said output terminals, said switching means including a first SiC-MOSFET having a drain connected to said rectifying unit and a source connected to one of said output terminals and a second SiC-MOSFET having a drain connected to said rectifying unit and a source connected to a remaining other of said output terminals; and control means, disposed in said housing and connected to said switching means and said field coil, for controlling said switching means and said field current supply circuit so as to selectively supply said rectified output power to said battery and to said high-voltage load in response to said command signal.

8. An electric power supply system for a vehicle according to claim 7, wherein said rectifying unit has positive-side and negative side cooling fins, each of said first and said second SiC-MOSFETs has a terminal connected to said positive side cooling fin of said rectifying unit together with a rectifying element of said positive side.

9. An electric power supply system for a vehicle according to claim 7, wherein said alternator further comprises a cooling fan, and said switching means has cooling fins disposed in said housing to be cooled by said cooling fan.

10. An electric power supply system for a vehicle according to claim 7, wherein each of said SiC-MOSFETs has a P-well region and N$^+$ region and a series circuit of a parasitic diode and a high resistance conductor connected between said P-well region and N$^+$ region.

11. An electric power supply system for supplying power to a battery at a battery voltage and to a high-voltage electric load of a vehicle at a voltage higher than said battery voltage in response to a command signal, said electric power supply system comprising:

an alternator having a housing, a multi-phase armature winding, a field current supply circuit including a field coil and at least first and second output terminals respectively connected to said battery and said high-voltage electric load, and a rectifying unit connected between said armature winding;

a switching circuit disposed in said housing and having at least two SiC-MOSFETs, wherein at least one of said SiC-MOSFETs is connected between said armature winding and each of said output terminals; and a control system, disposed in said housing and connected to said switching means and said field coil, that controls said switching circuit and said field current supply circuit such that rectified output power from said rectifying unit is selectively supplied to said battery and said high-voltage load in response to said command signal.

12. An electric power supply system for supplying power to a battery at a battery voltage and to a high-voltage electric load of a vehicle at a voltage higher than said battery voltage, said electric power supply system comprising:

an alternator having a housing, a multi-phase armature winding, a field coil, a first and a second rectifying unit connected to said armature coil, a first output terminal connected to said battery and a second output terminal connected to said high-voltage electric load;

a first SiC-MOSFET switching element disposed in said housing and connected between said first rectifying unit and said first output terminal;

a second SiC-MOSFET switching element disposed in said housing and connected between said second rectifying unit and said second output terminal; and a control system, connected to said first and said second SiC-MOSFET switching elements, that controls said first and said second SiC-MOSFET switching elements such that said battery voltage is selectively supplied to said battery and such that said voltage higher than said battery voltage is selectively supplied to said high-voltage electric load.

13. An electric power supply system for supplying power to a battery at a battery voltage and for supplying to a high-voltage electric load of a vehicle a voltage higher than said battery voltage in response to a command signal, said electric power supply system comprising:

an alternator having a housing, a multi-phase armature winding, a field current supply circuit including a field coil and at least a first and a second output terminal respectively connected to said battery and high-voltage electric load, and a rectifying unit connected between said armature winding;

a switching circuit disposed in said housing and connected between said rectifying unit and each of said output terminals, said switching circuit including a first SiC-MOSFET having a drain connected to said rectifying unit and a source connected to one of said output terminals and a second SiC-MOSFET having a drain connected to said rectifying unit and a source connected to a remaining other of said output terminals; and control system, disposed in said housing and connected to said switching circuit and said field coil, for controlling said switching circuit and said field current supply circuit so as to selectively supply said rectified output power to said battery and to said high-voltage load in response to said command signal.

* * * * *